US009673017B1

(12) United States Patent
Adamec

(10) Patent No.: US 9,673,017 B1
(45) Date of Patent: Jun. 6, 2017

(54) HOUSING DEVICE FOR MAGNETIC SHIELDING, HOUSING ARRANGEMENT FOR MAGNETIC SHIELDING, CHARGED PARTICLE BEAM DEVICE, AND METHOD OF MANUFACTURING A HOUSING DEVICE

(71) Applicant: ICT Integrated Circuit Testing Gesellschaft für Halbleiterprüftechnik mbH, Heimstetten (DE)

(72) Inventor: Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 18 days.

(21) Appl. No.: 14/947,723

(22) Filed: Nov. 20, 2015

(51) Int. Cl.
*H01J 37/00* (2006.01)
*H01J 37/09* (2006.01)
*H01J 37/28* (2006.01)

(52) U.S. Cl.
CPC .............. *H01J 37/09* (2013.01); *H01J 37/28* (2013.01); *H01J 2237/0264* (2013.01)

(58) Field of Classification Search
CPC ..... H01J 37/09; H01J 37/28; H01J 2237/0264
USPC .......... 250/492.1–492.3, 306, 307, 310, 311, 250/396 R, 396 ML
See application file for complete search history.

(56) References Cited

U.S. PATENT DOCUMENTS

2015/0311030 A1* 10/2015 Platzgummer ........ H01J 37/147
250/396 R

* cited by examiner

*Primary Examiner* — Micheal Maskell
(74) *Attorney, Agent, or Firm* — Kilpatrick Townsend & Stockton LLP

(57) ABSTRACT

A housing device for providing a magnetic shielding of a charged particle beam is described. The housing device includes a housing element configured to at least partially enclose a charged particle beam propagation path and comprising a magnetic shielding material, wherein the housing element includes an inner surface directed toward the charged particle beam propagation path, an outer surface directed away from the charged particle beam propagation path and at least one edge region with an edge surface connecting the inner surface with the outer surface; and a contacting element comprising a conductive material and fixed to the at least one edge region in at least one of a form-fit connection and a bonded connection. Further, a housing arrangement including two or more electrically contacting housing devices, a charged particle beam device with a housing device, and methods of manufacturing a housing device are described.

20 Claims, 5 Drawing Sheets

HOUSING DEVICE FOR MAGNETIC SHIELDING, HOUSING ARRANGEMENT FOR MAGNETIC SHIELDING, CHARGED PARTICLE BEAM DEVICE, AND METHOD OF MANUFACTURING A HOUSING DEVICE

TECHNICAL FIELD

Embodiments described herein relate to a housing device for providing a magnetic shielding of a charged particle beam, e.g. an electron beam, for example, for inspection system applications, testing system applications, defect review or critical dimensioning applications, surface imaging applications (SEM) or the like, as well as to methods of manufacturing a housing device. Embodiments also relate to a housing arrangement for providing a magnetic shielding of a charged particle beam comprising two or more housing devices, and to a charged particle beam device with at least one housing device or housing arrangement.

BACKGROUND

Modern semiconductor technology has created a high demand for structuring and probing specimens in the nanometer or even in the sub-nanometer scale. Micrometer and nanometer scale process control, inspection or structuring, is often done with charged particle beams, e.g. electron beams, which are generated, shaped, deflected and focused in charged particle beam devices, such as electron microscopes or electron beam pattern generators. For inspection purposes, charged particle beams offer superior spatial resolution compared to, e.g., photon beams because their wavelengths are shorter than the wavelengths of light beams.

Inspection devices using charged particle beams such as scanning electron microscopes (SEM) have many functions in a plurality of industrial fields, including, but not limited to, inspection of electronic circuits during manufacturing, exposure systems for lithography, detecting devices, defect inspection tools, and testing systems for integrated circuits. In such particle beam systems, fine probes with high current density can be used. For instance, in the case of an SEM, the primary electron (PE) beam generates particles like secondary electrons (SE) and/or backscattered electrons (BSE) that can be used to image and analyze a specimen.

Charged particle beams are typically directed, deflected, shaped, corrected, focused, and steered by electric and/or magnetic fields. For this purpose, electrostatic, magnetic and combined electrostatic-magnetic deflectors, lenses and stigmators, e.g. octupole devices, for providing magnetic and electric fields are typically arranged along the propagation path of the charged particle beam from the beam source to a beam target. In order to provide for a small focused spot on the beam target which allows for an increased spatial resolution, beam aberrations are compensated by applying exactly defined electric and magnetic correction fields to the charged particle beam. On the other hand, charged particle beams should be shielded from external electric and magnetic fields and environmental electromagnetic interferences, because low-mass charged particle beams such as electron beams are particularly sensitive to such electromagnetic interferences (EMI).

External magnetic fields in the typical laboratory environment can achieve a magnetic field strength of several mGauss. In order to guarantee a proper functioning of charged particle beam columns, these magnetic fields should be shielded by several orders of magnitude, leaving the residual fields inside the charged particle beam device in the range of sub μGauss. In order to obtain such a shielding within charged particle beam devices, the charged particle beam propagation path can be surrounded by housing devices configured for providing a magnetic shielding, for example, housing devices made of a high permeability material.

However, such shielding systems may not be sufficient. In particular, residual magnetic fields penetrating through the housing device into the inner volume of the charged particle beam device may negatively affect the beam shape quality or the beam direction and may superpose the electric and magnetic fields of beam deflector devices. Focal spot size and spatial resolution may be impaired.

Accordingly, there is a need for housing devices providing excellent magnetic shielding of charged particle beams, e.g. electron beams, along the propagation path from the beam source to the beam target, e.g. a specimen to be examined. In particular, a housing arrangement is needed which provides excellent shielding against EMI and can at the same time be provided as an enclosure of the charged particle beam in a quick and easy manner.

SUMMARY

In light of the above, according to the independent claims, a housing device and a housing arrangement for providing a magnetic shielding of a charged particle beam are provided. Further, a charged particle beam device with a housing device is provided. According to a further aspect, methods of manufacturing a housing device are provided. Further aspects, advantages, and features are apparent from the dependent claims, the description, and the accompanying drawings.

According to embodiments described herein, a housing device for providing magnetic shielding of a charged particle beam is provided, including: a housing element configured to at least partially enclose a charged particle beam propagation path and comprising a magnetic shielding material, wherein the housing element comprises an inner surface directed toward the charged particle beam propagation path, an outer surface directed away from the charged particle beam propagation path and at least one edge region with an edge surface connecting the inner surface with the outer surface; and a contacting element comprising a conductive material and fixed to the at least one edge region in at least one of a form-fit connection and a bonded connection.

According to a further aspect described herein, a housing arrangement for providing magnetic shielding of a charged particle beam is provided, including a housing device and a further housing device arranged next to the housing device. The housing device includes a housing element configured to at least partially enclose a charged particle beam propagation path and comprising a magnetic shielding material, wherein the housing element comprises an inner surface directed toward the charged particle beam propagation path, an outer surface directed away from the charged particle beam propagation path, and at least one edge region with an edge surface connecting the inner surface with the outer surface; and a contacting element comprising a conductive material and fixed to the at least one edge region in at least one of a form-fit connection and a bonded connection. The further housing device is configured to at least partially enclose the charged particle beam propagation path, comprises the magnetic shielding material, and contacts the contacting element of the housing device.

According to a further aspect described herein, a charged particle beam device is provided, including: a beam source for generating a charged particle beam propagating along a charged particle beam propagation path toward a beam target; and at least one housing device or housing arrangement for providing magnetic shielding of the charged particle beam in at least one propagation section between the beam source and the beam target to shield the charged particle beam from external magnetic fields. The housing device includes: a housing element configured to at least partially enclose the charged particle beam propagation path and comprising a magnetic shielding material, wherein the housing element comprises an inner surface directed toward the charged particle beam propagation path, an outer surface directed away from the charged particle beam propagation path and at least one edge region with an edge surface connecting the inner surface with the outer surface; and a contacting element comprising a conductive material and fixed to the at least one edge region in at least one of a form-fit connection and a bonded connection.

According to a further aspect described herein, a method of manufacturing a housing device for providing magnetic shielding of a charged particle beam is provided, including: providing a housing element configured to at least partially enclose a charged particle beam propagation path and comprising a magnetic shielding material, wherein the housing element comprises an inner surface directed toward the charged particle beam propagation path, an outer surface directed away from the charged particle beam propagation path and at least one edge region with an edge surface connecting the inner surface with the outer surface; fixing a contacting element comprising a conductive material to the at least one edge region of the housing element in a form-fit or bonded connection.

Embodiments are also directed at apparatuses for carrying out the disclosed methods and include apparatus parts for performing the individual method actions. This method may be performed by way of hardware components, a computer programmed by appropriate software, by any combination of the two or in any other manner. Furthermore, embodiments are also directed at methods of operating the described apparatus.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Figure 1A:
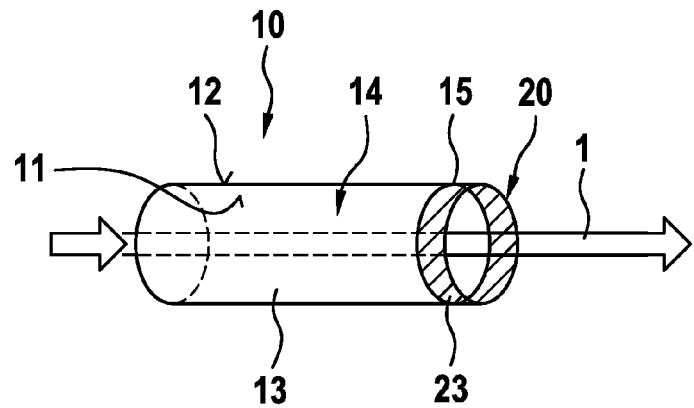
FIG. 1A shows a housing device according to embodiments described herein in a schematic view.

Reference will now be made in detail to the various embodiments, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Without limiting the scope of protection of the present application, in the following, a charged particle beam is a beam of charged particles, e.g. electrons or ions, propagating along a charged particle beam propagation path. The charged particle beam propagation path may be at least partially or entirely located inside a housing or enclosure of a charged particle beam device. The charged particle beam may be generated by a beam source configured for emitting a charged particle beam.

As described herein, a cold field emitter (CFE), a Schottky emitter, a TFE or another high current electron beam source may be provided as the beam source. A high current is considered to be 10 µA in 100 mrad or above, for example up to 5 mA. According to typical implementations, the current is distributed essentially uniformly, e.g. with a deviation of +−10%. According to some embodiments, which can be combined with other embodiments described herein, the beam source or virtual source can have a diameter of 2 nm to 40 nm and/or have a typical emission half angle of 5 mrad or above, e.g. 50 mrad to 200 mrad. According to yet further embodiments, which can be combined with other embodiments described herein, a TFE or another high reduced-brightness source, e.g. an e-beam source, capable of providing a large beam current is a source where the brightness does not fall by more than 20% of the maximum value when the emission angle is increased to provide a maximum of 10 µA-100 µA.

After leaving the beam source, the generated charged particle beam may be collimated by a condenser lens to propagate along the charged particle beam propagation path toward a beam target such as a specimen to be examined or probed. Along the charged particle beam propagation path, one or more electrostatic or magnetic devices for influencing the shape and/or direction of the charged particle beam may be provided. For example, one or more electrostatic and/or magnetic multipole devices may be provided for at least one of focusing, deflecting, shaping, and compensating aberrations of the charged particle beam. The charged particle beam does not necessarily extend along a linear trajectory, but may be curved, bended and/or reflected.

The charged particle beam device can for example be an electron microscope, such as a scanning electron microscope (SEM) or a scanning transmission electron microscope (STEM), or a focused ion beam system (FIB). An electron microscope can for example be an electron microscope for critical dimensioning (CD), defect review (DR), or inspection (EBI, that is electron beam inspection). According to some embodiments described herein, which can be combined with other embodiments described herein, the charged particle beam device is an electron beam apparatus such as a focused electron beam apparatus. The charged particle beam device may be configured for high resolution imaging such as SEM.

The charged particle beam device may be capable of detecting secondary charged particles such as secondary electrons (SE) and/or backscattered charged particles (BSE) which are generated by a primary charged particle beam hitting on a beam target. Also the secondary charged particles may form a charged particle beam propagating along a charged particle beam propagation path toward a detector device.

Charged particle beams such as electron beams are sensitive to external magnetic fields and other external electromagnetic interferences. In order to shield charged particle beams from external magnetic fields which may be present for example in laboratory environments, the charged particle beam propagation path may be at least partially enclosed by a housing device configured for magnetic shielding. In the case of essentially constant or static magnetic fields, the magnetic field strength in a volume which is entirely or at least partially enclosed by such a housing device may be several orders of magnitudes smaller as compared to the magnetic field strength outside the housing.

Housing devices configured for magnetic shielding may comprise or consist of magnetic shielding materials such as materials with a high magnetic permeability. These materials provide a path for the magnetic field lines around the shielded volume so that the magnetic field lines do not penetrate inside the shielded volume. Magnetic permeability is the measure of the ability of a material to support the formation of a magnetic field within itself. The relative permeability of a material is the ratio of a specific material permeability to the permeability of free space $\mu_0$. Static magnetic fields can be shielded efficiently by applying housing devices made of such materials around the volume to be shielded.

However, not only constant magnetic fields may be present in a typical laboratory environment, but also fluctuating or oscillating magnetic fields and other electromagnetic interferences. For example, electromagnetic(em)-fields oscillating at typical line frequencies of 50 Hz and/or 60 Hz may be present. Further, em-fields oscillating at frequencies in the range between 6 kHz and 12 kHz, typically about 9 kHz, and others may be generated by typical electrical equipment. These and other electromagnetic interferences may negatively affect the quality of charged particle beams propagating in charged particle beam devices and should be shielded as well.

Shielding efficiency for various types of magnetic fields and em-fields may be improved by applying several housing devices inside one another so that multiple shielding layers are provided, by providing several housing devices overlapping with each other and/or by manufacturing the housing devices of high-permeability materials. However, in the complexity of typical charged particle beam devices it is still challenging to eliminate all weak spots.

Embodiments described herein are made for providing excellent shielding against static and oscillating magnetic fields and electromagnetic fields, also in case of complex designs of charged particle beam devices.

FIG. 1A shows a housing device 10 for providing a magnetic shielding of a charged particle beam according to embodiments described herein in a schematic view. The housing device 10 includes a housing element 14 configured for at least partially enclosing a charged particle beam propagation path 1 and comprising a magnetic shielding material 13, wherein the housing element 14 comprises an inner surface 11 directed toward the charged particle beam propagation path 1, an outer surface 12 directed away from the charged particle beam propagation path and at least one edge region with an edge surface 15 connecting the inner surface 11 with the outer surface 12; and a contacting element 20 comprising a conductive material 23 and fixed to the edge region of the housing element in at least one of a form-fit connection and a bonded connection.

In other words, the housing device 10 according to embodiments described herein comprises a housing element 14 comprising a magnetic shielding material and a contacting element 20 comprising a conductive material electrically contacting at least one edge region of the housing element. In some embodiments, the housing element 20 may comprise two or more edge regions, wherein a contacting element is fixed to at least two edge regions or to all of the edge regions. In some embodiments such as the embodiment shown in FIG. 1A, the contacting element 20 is directly fixed to the edge surface 15 in a form-fit connection and/or in a bonded connection.

The edge surface 15 of the housing element may be a surface extending at an angle, e.g. radially, with respect to the charged particle beam propagation path 1 and may constitute a transition between the outer surface 12 and the inner surface 11 of the housing element. In some embodiments, the outer surface and the inner surface of the housing element extend at least partially essentially parallel to the charged particle beam propagation path 1, and the edge surface 15 extends transverse or perpendicular to the charged particle propagation path.

In some embodiments, the edge surface 15 constitutes the border of an opening, slit, or a gap provided in a wall of the housing element. In some embodiments, the edge surface 15 constitutes a front end, rear end and/or side end of the housing element. In some embodiments, the edge surface 15 runs partially or completely around the charged particle beam propagation path, e.g. in a circumferential direction. In some embodiments, the edge surface 15 runs at least partially parallel with respect to the charged particle beam propagation path, e.g. when the edge region is provided at least partially as the margin of a slit opening in the wall of the housing element.

Figure 1B:
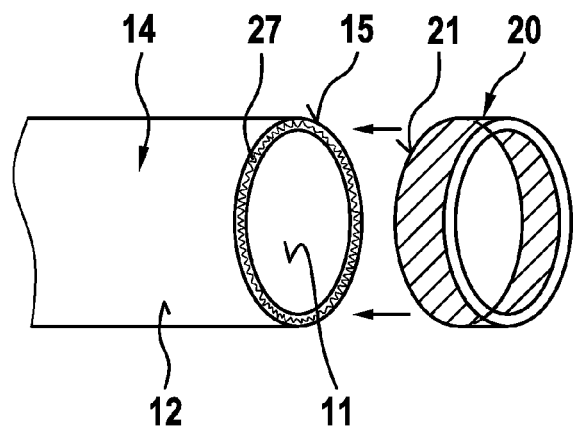
FIG. 1B shows an edge region of the housing device of FIG. 1A during manufacturing of the housing device in an enlarged view.

In the embodiments shown in FIG. 1A and FIG. 1B, the housing element 14 comprises a tubular portion surrounding the charged particle beam propagation path 1, wherein at least one end of the tubular portion, e.g. the front end, comprises the edge region with the edge surface 15.

This setup of the housing device 10 is based on the finding that oscillating electromagnetic fields may lead to so called Eddy currents that are generated in the outer surface of the housing element. Eddy currents are circular electric currents induced by a varying external magnetic field and flowing in planes perpendicular to the magnetic field in the outer surface. Due to the skin effect, Eddy currents are typically localized at material regions near the outer surface. However, Eddy currents can penetrate to the inner surface of the housing element through openings, gaps and other discontinuities in the surface. On the internal surface of the housing device, Eddy currents can create again disturbing magnetic fields inside the shielded volume. For example, Eddy currents may be induced by em-field oscillating at frequencies of 50 Hz or 9 kHz.

By fixing the contacting element 20 made of the conductive material 23 to at least one edge region of the housing element so that the contacting element 20 electrically contacts the edge region and particularly the edge surface 15, a spread of Eddy currents to the inner surface 11 can be prevented. This is because the high conductivity of the contacting element 20 provides a shortcut for Eddy currents before they can spread over to the inner surface or jump to a neighboring housing element. Thus, the efficiency of the magnetic shielding can be dramatically improved, because no disturbing Eddy currents on the inner surface may arise.

A magnetic shielding material 13 as used herein may be a material with a high magnetic permeability. For example, the relative permeability of the magnetic shielding material in some embodiments described herein may be 1.1 or more (1 is the relative magnetic permeability of vacuum), particularly 10 or more, more particularly 100 or more, more particularly 500 or more, and most particularly 10,000 or more. Typical magnetic shielding materials used herein may consist of at least one of a soft magnetic alloy, a nickel-iron alloy or a permalloy. A magnetic shielding material that may be used for providing a particularly high magnetic shielding effect comprises or is a mu-metal. Mu-metals are special nickel-iron alloys with a very high permeability for magnetic shielding of sensitive charged particle beams. The relative magnetic permeability of the magnetic shielding materials comprising Mu-metal may be 50,000 or more or 100,000 or even more. The magnetic shielding material 13 may be conductive, wherein the conductivity is typically smaller than the conductivity of the conductive material 23.

The conductive material 23 as used herein may be a material with a high electrical conductivity such as a metal. The conductivity of the conductive material may be $1 \times 10^6$ S/m or more, particularly $2 \times 10^7$ S/m or more, more particularly $5 \times 10^7$ S/m or more. In some embodiments described herein, the conductive material may be at least one of copper, silver and bronze. The conductive material 23 may have a relative permeability higher than 1, wherein the permeability of the conductive material 23 may be smaller than the permeability of the magnetic shielding material 13. In some cases, the conductivity of the conductive material 23 is higher and the permeability of the conductive material 23 is smaller as compared to the magnetic shielding material 13.

In order to effectively provide an electrical shortcut for Eddy currents, the connection between the edge region of the housing element and the contacting element should be low-resistive. For example, a contact resistance between the edge region and the contacting element according to some implementations should be in the sub mΩ-range or in the sub μΩ-range. A form-fit and/or a bonded connection is suitable for providing a low-resistive connection, as the resistance of a connection depends on the effective contact surface and on the contacting materials. A large contacting surface may be provided by a form-fit connection. The effect of a surface roughness which may decrease the effective contacting surface may be reduced by providing a bonded-connection. In some embodiments, a combined form-fit and bonded connection may be used.

In some embodiments, which may be combined with other embodiments described herein, the contacting element 20 is at least one of brazed, soldered and welded to the edge region. Brazing is a joining process in which the edge region and the contacting element are joined together by melting and flowing a filler material 27 into the joint. The filler material, e.g. a conductive filler metal, may have a lower melting point than the adjoining elements. Brazing may lead to a highly conductive connection which is at the same time solid and durable. Instead of using an additional filler material 27, in some implementations, the material of the contacting element (e.g. copper) or of the housing element itself may be heated and melted, and the brazed connection can be established by joining together and cooling the components to be connected. In this case, the material of at least one of the components to be connected itself is used as the filler material.

As is depicted in FIG. 1B in an exemplifying way, in some implementations, the bonded connection may be configured such that a conductive filler material 27 or conductive adhesive agent covers more than 50% or more than 80% of the edge surface 15. Additionally or alternatively, the filler material 27 may partially or completely bridge a gap between the edge surface 15 and the contacting element 20. For example, when the edge surface extends in a circumferential direction around the charged particle beam 1, the filler material may be provided along more than 50%, particularly along more than 85% and more particularly along more than 95% of the extension of the edge surface 15 in the circumferential direction. In the embodiment shown in FIG. 1B, the filler material 27 covers the entire edge surface 15 in a circumferential direction.

In some examples, the contacting element may be brazed to the edge surface 15, wherein the conductive filler material may cover 80% or more, particularly 95% or more of the edge surface, so that surface roughness effects of the two contacting surfaces which may increase the resistivity of the connection may be considerably reduced or avoided. In some embodiments, a highly conductive filler material may be used, e.g. filler metals such as copper or copper alloys. Brazing can create an excellent electrical contact between the housing element and the contacting element.

In order to further improve the connection between the edge region and the contacting element 20, the contacting element 20 may be provided with a flat bonding surface 21 which is fixed to the edge region such that the bonding surface partially or completely covers the edge surface 15 and/or is in planar contact with the edge surface 15. For example, the bonding surface 21 may contact the edge surface 15 in a contact area larger than 10 cm², particularly larger than 100 cm².

In some embodiments, which may be combined with other embodiments described herein, the edge surface 15 is provided as an end surface of a tubular portion of the housing device surrounding the charged particle beam propagation path 1. The contacting element may be provided as a ring element which is fixed to the end surface of the tubular portion. The diameter of the ring element may essentially correspond to the diameter of the tubular portion. In some cases, the outer diameter of the ring element may correspond to the outer diameter of the tubular portion and/or the inner diameter of the ring element may correspond to the inner diameter of the tubular portion. In same implementations, the inner diameter of the ring element may be 10 cm or larger, particularly 15 cm or larger and/or 50 cm or smaller. In other words, the edge surface 15 may be provided as a first annular surface surrounding the charged particle beam propagation path and the contacting element may comprise a second annular surface to be fixed to the first annular surface.

As is shown in FIG. 1A in a schematic way, the housing element may be provided as a tubular member, particularly as a cylinder tube, wherein at least one end surface of the cylinder tube constitutes the edge surface 15 at which the contacting element 20 is fixed.

Figure 2:
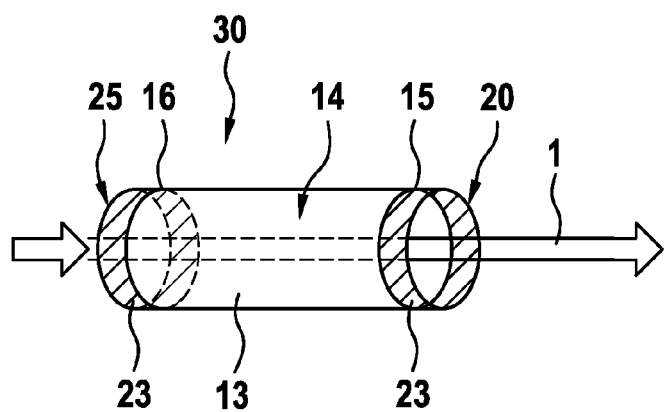
FIG. 2 shows a housing device according to embodiments described herein in a schematic view.

FIG. 2 shows a housing device 30 according to embodiments described herein in a schematic view. The basic setup of the housing device 30 corresponds to the setup of the example shown in FIG. 1A so that reference can be made to the above explanations.

The housing device 30 includes a housing element 14 which is provided as a tubular member having a front end and a rear end. Typically, housing devices configured for magnetic shielding of a charged particle beam may be provided as cylindrical elements, wherein the charged particle beam propagation path may extend along a longitudinal axis inside the cylindrical element, particularly along the center of the cylindrical element.

The tubular member may have an outer diameter of 10 cm or more, particularly 30 cm or more and/or 1 m or less. Alternatively or additionally, the tubular member may have a length along the charged particle beam propagation path of 30 cm or more, particularly 50 cm or more. Alternatively or additionally, a wall thickness of the tubular member may be 2 mm or more, particularly 1 cm or more, more particularly 2 cm or more. The tubular member may comprise or consist of a magnetic shielding material.

In the example shown in FIG. 2, the front end of the housing element 14 comprises the edge surface 15 connecting the inner surface and the outer surface of the housing element 14, and the rear end of the housing element 14 comprises a second edge surface 16 connecting the outer surface and the inner surface of the housing element. Both the edge surface 15 and the second edge surface 16 may be annular surfaces which surround the charged particle beam propagation path in the circumferential direction.

In some implementations, the tubular member may be provided with a curve and/or may be provided as an angled tube. In some implementations, the diameter of the tubular member may vary along the longitudinal direction. For example, the tubular member may be provided with steps or other discontinuities in the outer surface and/or in the inner surface.

A contacting element 20 provided as a conductive ring may be fixed to the front end of the housing element 14, and a second contacting element 25 provided as a second conductive ring may be fixed to the rear end of the housing element 14. In some embodiments, the contacting element 20 is fixed to the edge surface 15 in a bonded connection, particularly in a brazed connection, and/or the second contacting element 25 is fixed to the second edge surface 16 in a bonded connection, particularly in a brazed connection. Both connections may be established as exemplified in FIG. 1B.

In some implementations, a side wall of the housing element does not have any openings or gaps. For example, a wall of the tubular member shown in FIG. 2 is provided as a closed cylinder wall between the front end and the rear end. Therefore, apart from the edge surface 15 and the second edge surface 16 which are covered by a contacting element, respectively, no further edge surfaces connecting the inner surface and the outer surface are existent. Therefore, Eddy currents generated in the outer surface of the housing device 14 cannot spread over to the inner surface so that the shielding efficiency can be substantially improved. Static or slowly varying magnetic fields cannot penetrate through the magnetic shielding material 13 of the housing element, and oscillating fields can lead to Eddy currents only in the outer surface, where Eddy currents do not have the ability to lead to disturbing magnetic fields in the shielded inner volume.

Figure 3:
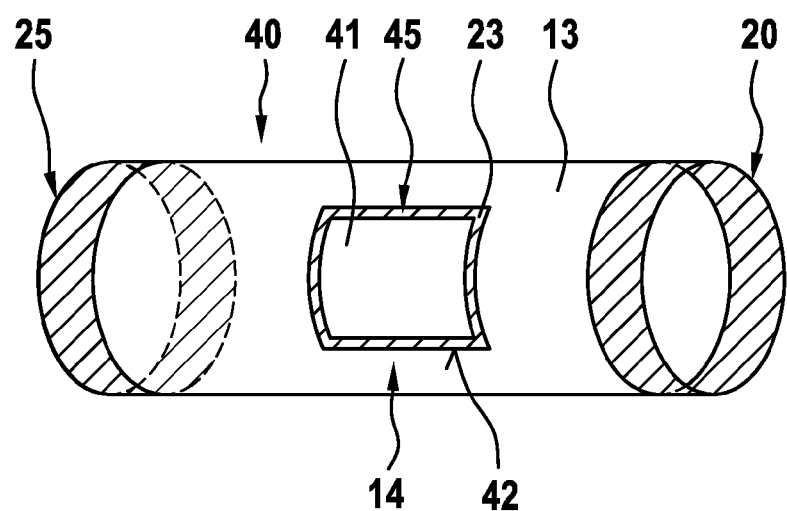
FIG. 3 shows a housing device according to embodiments described herein in a schematic view.

FIG. 3 shows a housing device 40 according to embodiments described herein in a schematic view. The basic setup of the housing device 30 corresponds to the setup of the example shown in FIG. 2 so that reference can be made to the above explanations.

In addition to the contacting element 20 fixed to the front end of the housing element 14 and the second contacting element 25 fixed to the rear end of the housing element 14, the housing device 40 includes a third contacting element 45 fixed to an edge region of an opening 41 provided in a side wall of the housing element 14. In some implementations, the side wall of the housing device 40 includes two or more openings, wherein a contacting element may be fixed to the edge region of all of the openings.

The opening 41 may be provided in an arbitrary shape, e.g. as a round, oval, polygonal, rectangular or slit opening. The edge region of the opening 41 may have a third edge surface 42 connecting the inner surface and the outer surface of the housing element 14, wherein the third contacting element 45 may be bonded to the third edge surface 42, particularly brazed to the third edge surface 42. Thus, Eddy currents cannot spread through the edge region of the opening 41 to the inner surface. In some embodiments, the contacting element 45 covers and electrically contacts the entire edge of the opening 41.

Figure 4:
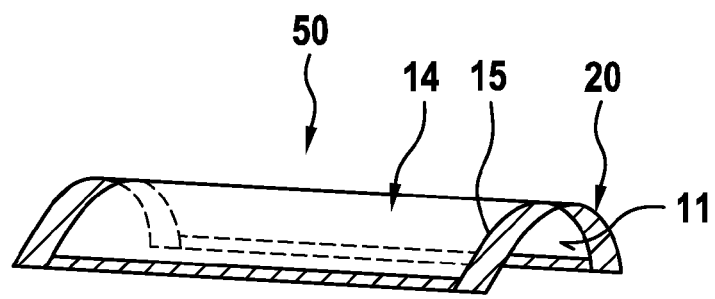
FIG. 4 shows a housing device according to embodiments described herein in a schematic view.

FIG. 4 shows a housing device 50 according to embodiments described herein in a schematic view. The housing element 14 of the housing device 50 is provided as a semi-cylinder so that two housing devices 50 may be combined to form a tubular housing device similar to the housing device shown in FIG. 2.

The edge surface 15 of the semi-cylindrical housing element 14 extends along the front end and along the rear end of the housing element 14 as well as parallel to the charged particle beam propagation path 1 between the front end and the rear end. The contacting element 20 made of the conductive material 23 is fixed to the edge surface 15 so that the entire edge surface 15 is covered, and the entire edge region is electrically connected to the highly conductive contacting element. Thus, Eddy currents cannot spread via the edge region of the housing element 14 to the inner surface 11.

Figure 5:
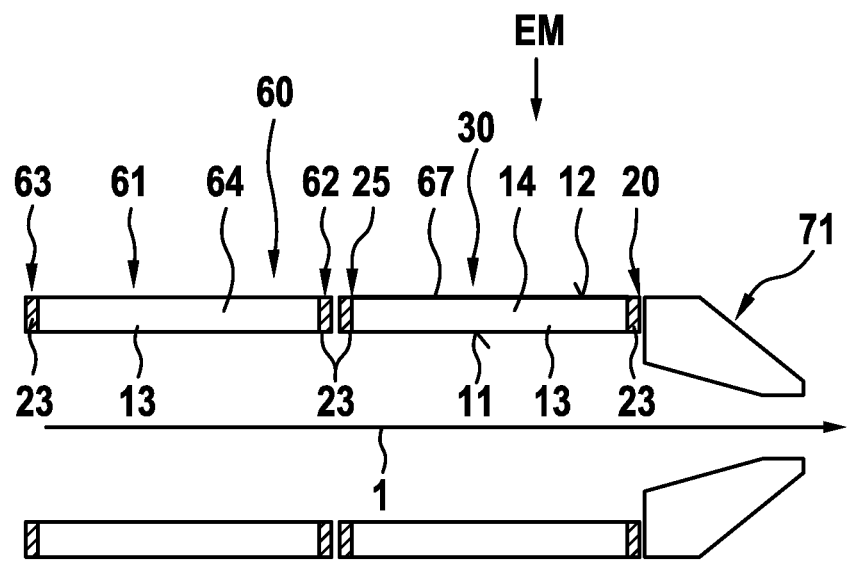
FIG. 5 shows a housing arrangement according to embodiments described herein in a schematic view.
Figure 6:
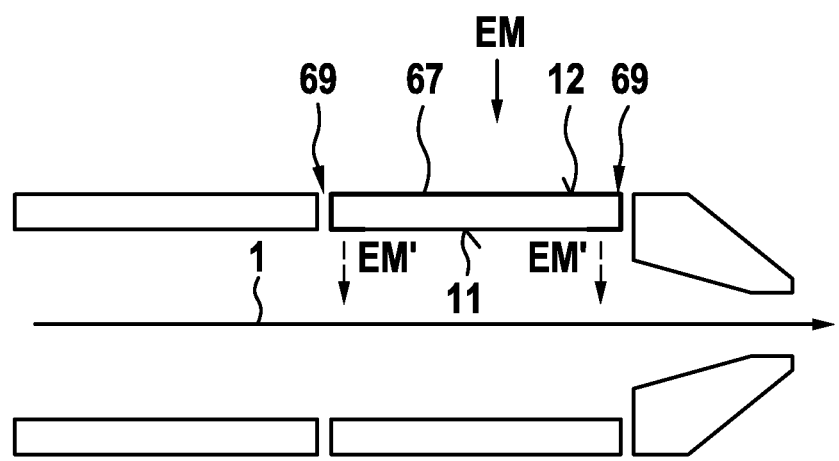
FIG. 6 shows a comparative example of a housing in a schematic view.

FIG. 5 shows a housing arrangement 60 with a housing device 30 according to embodiments described herein in a schematic view. The housing device 30 of the housing arrangement 60 shown in FIG. 5 corresponds to the housing device shown in FIG. 2 so that reference can be made to the above explanations. Instead of the housing device 30, another housing device described herein may be used.

The housing arrangement 60 is configured for providing a magnetic shielding of a charged particle beam and includes the housing device 30 and at least one further housing device 61 arranged next to the housing device 30. The housing device 30 and the further housing device 61 may be arranged adjacent to each other in the direction of the charged particle beam propagation path 1. For example, the further housing device 61 may enclose a first propagation section of the charged particle beam, and the housing device 30 may enclose a second propagation section of the charged particle beam downstream from the first propagation section.

Both the housing device 30 and the further housing device 61 are configured for at least partially enclosing the charged particle beam propagation path 1 and comprise a housing element made of the magnetic shielding material 13. In the implementation shown in FIG. 5, the housing device 30 includes a housing element 14 in the form of a cylindrical tube with a front end and a rear end, and the further housing device 61 includes a further housing element 64 in the form of a cylindrical tube with a front end and a rear end. A contacting element 20 provided as a conductive ring element is fixed to the front end and a second contacting element 25 provided as a conductive ring element is fixed to the rear end of the housing element 14. A third contacting element 62 provided as a conductive ring element is fixed to the front end and a fourth contacting element 63 provided as a conductive ring element is fixed to the rear end of the further housing element 64.

Therefore, all edge regions are contacted by a conductive element so that no Eddy currents can spread to the inner surface and create disturbing magnetic fields in the shielded volume. It is schematically indicated in FIG. 5 that an Eddy current 67 that is generated in the outer surface 12 of the housing element 14 by an oscillating external electromagnetic field EM is blocked on both end faces of the housing device 30 by the highly conductive contacting elements 20, 25.

Figure 7:
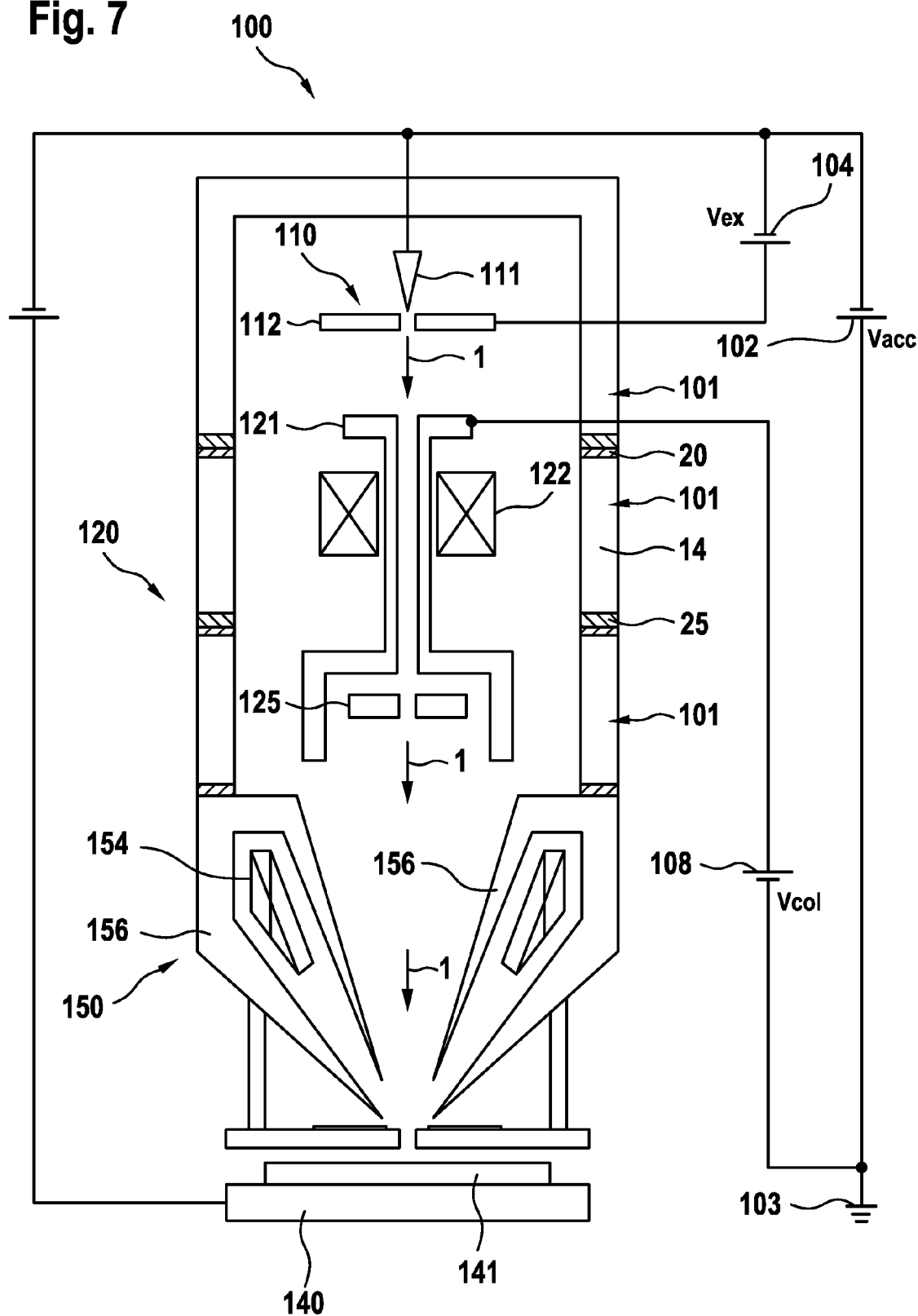
FIG. 7 shows a charged particle beam device according to embodiments described herein in a schematic view.

On the other hand, as is shown in the comparative example of FIG. 7 in a schematic way, an Eddy current 67 generated in the outer surface 12 by an oscillating external electromagnetic field EM may spread via the edge regions 69 to the inner surface 11, as no contacting elements are fixed to the edge regions 69 of the comparative example shown in FIG. 7. Eddy currents flowing along the inner surface 11 which is directed to the charged particle beam propagation path 1 may generate disturbing electromagnetic fields EM' in the inner shielded volume of the housing arrangement. Thus, the quality of the charged particle beam shape may be impaired.

The further housing device 61 may electrically contact the housing device 30. For example, one of the contacting elements of the further housing device (contacting element 62) may electrically contact one of the contacting elements of the housing device (contacting elements 25). Thus, a housing arrangement without any gaps between the individual housing devices may be provided. Penetration of magnetic fields through gaps or openings into the shielded inner volume may be prevented.

In the example shown in FIG. 5, the setup of the housing device 30 corresponds to the setup of the further housing device 61. Therefore, the contacting element 25 provided as a ring element may contact the contacting element 62 provided as an identical ring element in a circumferential direction around the charged particle beam propagation path. A gap-free connection between the housing devices may be provided, particularly when the ring elements each have a flat contacting surface directed toward the neighboring housing device, wherein the contacting surfaces may be applied to each other.

The housing device 30 and the further housing device 61 can be fixed to each other. Alternatively or additionally, an electrical connection between the housing device 30 and the further housing device 61 may be achieved by connection elements such as a contact spring arranged in a gap between the housing device and the further housing device. Contact springs may be provided as bronze springs. Thus, Eddy currents can flow between the adjacent housing devices, so that the amount of Eddy currents spreading to the inner surfaces may be even further reduced.

However, as the edge regions of the housing devices according to embodiments described herein are terminated by the contacting elements, respectively, an electrical contact between adjacent housing devices may not be needed. For example, even in the case of a gap between adjacent housing devices, the spread of Eddy currents to the inner surfaces of the housing devices can be reduced or prevented. FIG. 5 shows a small air gap between the housing device 30 and the further housing device 61. Instead of providing the air gap, the contacting element 25 may be pressed on the third contacting element 62.

In dependence on the setup, size, and dimension of the charged particle beam device to be provided with the housing arrangement, more than two housing devices may be used. For example, two or more housing devices 30 provided as cylinder tubes may be arranged in a row next to each other to provide for an extended linear (or curved) beam propagation path section from a beam source to a beam target. An arbitrary setup of differently sized housing devices as needed for a specific charged particle beam device is possible. For example, also the front housing part 71 shown in FIG. 5 may be provided with one or more contacting elements (not shown).

The housing arrangement according to embodiments described herein can be installed and deinstalled in a very quick and easy manner, as no complicated mechanical or electrical connection of the individual housing devices may be needed. Further, the housing arrangement may not be provided in the form of one integral and completely closed enclosure, because two or more comparatively small housing devices can be easily connected and disconnected to form and dismount the housing arrangement.

FIG. 7 shows a charged particle beam device 100 according to embodiments described herein in a schematic view.

The charged particle beam device 100 includes: a beam source 110 for generating a charged particle beam propagating along a charged particle beam propagation path 1 toward a beam target 141, and one or more housing devices 101 or a housing arrangement according to embodiments described herein surrounding the charged particle beam propagation path 1 in at least one propagation section between the beam source 110 and the beam target 141 to shield the charged particle beam from external magnetic fields.

The charged particle beam device 100 can be, for example, a focused electron beam apparatus. The beam source 110 can be an emitter with an emission tip 111 adapted to emit electrons. An example is a thermal field emitter which allows emission of a bright electron beam from a small emitter area. The charged particle beam device 100 furthermore includes a column 120 for guiding the charged particles emitted from the beam source 110. The charged particles, which are electrons in embodiments described herein, are accelerated and pass the column 120 at comparably high energy. The high energy allows reduction of electron-electron interaction and thus reduces unwanted aberrations errors. A stage 140 is arranged downstream of column 120 which is below the column 120 in FIG. 7. Hence, the column 120 is arranged between the stage 140 and the beam source 110. The stage 140 is adapted to hold the beam target 141, e.g. a specimen to be examined.

FIG. 7 further illustrates that the charged particle beam device 100 may include an objective lens 150. Objective lens 150 can be considered as part of column 120.

Electron emitter 110 includes the emission tip 111 opposite an extraction electrode 112, which is positively biased (in case of electrons) to an extraction voltage Vex. In order to provide the extraction voltage, a power supply 104 is connected to the extraction electrode 112. Extraction electrode 112 is connected with the power supply 102 for providing the acceleration voltage Vacc, which can typically be connected to ground 103. Thus, the acceleration voltage Vacc determines the beam energy of electrons which are travelling in regions of the charged particle beam device 100 which are on ground potential or when hitting a grounded target.

Due to the acceleration voltage Vacc and the extraction voltage Vex, an electron beam is emitted by the beam source 110 and guided along the charged particle beam propagation path 1 within column 120. The charged particle beam, which is an electron beam in this embodiment, can then be focused by condenser lens 122 and objective lens 150 to be focused on the beam target 141. Typically, the objective lens 150 includes upper and lower pole pieces 156 and a coil 154.

According to yet further options, which can be used for embodiments described herein, the beam energy within the charged particle beam device can further be varied, typically increased, by applying a voltage Vcol to internal beam guiding components 121 of column 120 of the charged particle beam device 100. Accordingly, a power supply 108 can be connected to ground and the beam guiding components 121.

On impingement of the primary electron beam, which is emitted from the emission tip 111, secondary and/or backscattered particles are generated which can be detected by detector 125. In order to provide an image of a region of the beam target, scanning devices (not shown in FIG. 7) can be provided to scan the electron beam over the desired region of the beam target 141.

The housing devices 101 each include a housing element 14 comprising a magnetic shielding material and one or more contacting elements 20, 25 fixed to edge regions of the housing elements. The contacting elements may be made of a highly conductive material and be bonded, e.g. brazed, to the edge regions so that a gap-free and low-resistive connection between the contacting elements and the housing elements is provided.

Figure 8:
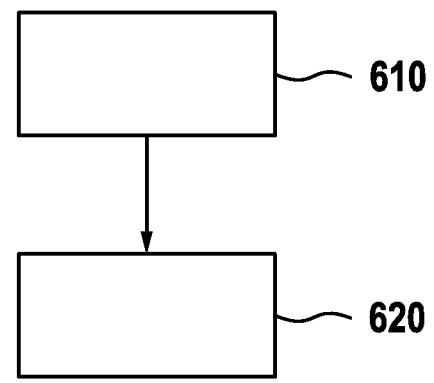
FIG. 8 is a flow diagram illustrating a method of manufacturing a housing device according to embodiments described herein.

FIG. 8 is a flow diagram illustrating a method of manufacturing a housing device for providing magnetic shielding of a charged particle beam, according to embodiments described herein.

The method includes, in box 610, providing a housing element configured for at least partially enclosing a charged particle beam propagation path and comprising a magnetic shielding material, wherein the housing element includes an inner surface directed toward the charged particle beam propagation path, an outer surface directed away from the charged particle beam propagation path and at least one edge region with an edge surface connecting the inner surface with the outer surface. Further, the method includes, in box 620, fixing a contacting element comprising a conductive material to the at least one edge region of the housing element in a form-fit or bonded connection.

In some implementations, fixing of the contacting element may include at least one of brazing, soldering and welding the contacting element to the at least one edge region of the housing element. For example, the contacting element may be brazed to the edge surface of the housing element.

The housing element may have at least one annular end face, and the contacting element may be provided as a conductive ring element which is brazed to the annular end face. In some implementations, a conductive ring element is both brazed to a front end and to a rear end of the housing element.

While the foregoing is directed to embodiments of the invention, other and further embodiments may be devised without departing from the basic scope thereof, and the scope thereof is determined by the claims that follow.

The invention claimed is:

1. A housing device for providing a magnetic shielding of a charged particle beam, comprising:
    a housing element configured to at least partially enclose a charged particle beam propagation path and comprising a magnetic shielding material, wherein the housing element comprises an inner surface directed toward the charged particle beam propagation path, an outer surface directed away from the charged particle beam propagation path and at least one edge region with an edge surface connecting the inner surface with the outer surface; and
    a contacting element comprising a conductive material and fixed to the at least one edge region in at least one of a form-fit connection and a bonded connection.

2. The housing device of claim 1, wherein the contacting element is at least one of brazed, soldered and welded to the edge region.

3. The housing device of claim 1, wherein the bonded connection is configured such that a conductive filler material or conductive adhesive agent covers more than 50% or more than 95% of the edge surface and bridges a gap between the edge surface and the contacting element.

4. The housing device of claim 1, wherein a flat bonding surface of the contacting element is in planar contact with the edge surface.

5. The housing device of claim 1, wherein the outer surface and the inner surface extend parallel with respect to each other, and the edge surface extends in a transverse direction with respect to the inner and outer surfaces.

6. The housing device of claim 1, wherein the housing element comprises a tubular portion partially or entirely surrounding the charged particle beam propagation path, wherein at least one end of the tubular portion comprises the edge region.

7. The housing device of claim 6, wherein the contacting element is provided as a ring element which is fixed to the end of the tubular portion.

8. The housing device of claim 1, wherein the housing element is provided as a tubular member, particularly as a cylinder tube.

9. The housing device of claim 8, wherein the contacting element is fixed to a front end of the tubular member and a second contacting element comprising a conductive material is fixed to a rear end of the tubular member in at least one of a form-fit connection and bonded connection.

10. The housing device of claim 1, wherein the relative magnetic permeability of the magnetic shielding material is higher than 10 or higher than 10000.

11. The housing device of claim 1, wherein the magnetic shielding material comprises at least one of a soft magnetic alloy, a nickel-iron alloy or a permalloy.

12. The housing device of claim 1, wherein the magnetic shielding material comprises a mu-metal.

13. The housing device of claim 1, wherein the conductivity of the conductive material is higher than $1 \times 10^6$ S/m.

14. The housing device of claim 13, wherein the conductivity of the conductive material is higher than $2 \times 10^7$ S/m.

15. The housing device of claim 1, wherein the conductive material comprises copper.

16. A housing arrangement for providing a magnetic shielding of a charged particle beam, comprising:
    a housing device, comprising:
        a housing element configured to at least partially enclose a charged particle beam propagation path and comprising a magnetic shielding material, wherein the housing element comprises an inner surface directed toward the charged particle beam propagation path, an outer surface directed away from the charged particle beam propagation path, and at least one edge region with an edge surface connecting the inner surface with the outer surface; and a contacting element comprising a conductive material and fixed to the at least one edge region in at least one of a form-fit connection and a bonded connection; and a further housing device arranged next to the housing device, which is configured for at least partially enclosing the charged particle beam propagation path and comprises the magnetic shielding material, wherein the contacting element contacts the further housing device.

17. The housing arrangement of claim 16, wherein the further housing device comprises:

a further housing element with a further edge region; and a further contacting element comprising a conductive material and fixed to the further edge region in at least one of a form-fit and bonded connection, wherein the contacting element of the housing device contacts the further contacting element of the further housing element.

18. A charged particle beam device, comprising:

a beam source for generating a charged particle beam propagating along a charged particle beam propagation path toward a beam target; and a housing device of claim 1 surrounding the charged particle beam propagation path in at least one propagation section between the beam source and the beam target to shield the charged particle beam from external magnetic fields.

19. A method of manufacturing a housing device for providing magnetic shielding of a charged particle beam, comprising:

providing a housing element configured to at least partially enclose a charged particle beam propagation path and comprising a magnetic shielding material, wherein the housing element comprises an inner surface directed toward the charged particle beam propagation path, an outer surface directed away from the charged particle beam propagation path and at least one edge region with an edge surface connecting the inner surface with the outer surface;

fixing a contacting element comprising a conductive material to the at least one edge region of the housing element in a form-fit or bonded connection.

20. The method of claim 19, wherein fixing the contacting element comprises at least one of brazing, soldering and welding the contacting element to the at least one edge region of the housing element.

* * * * *